(12) United States Patent
Maejima (10) Patent No.: US 7,449,948 B2
(45) Date of Patent: Nov. 11, 2008

(54) AMPLIFIER

(75) Inventor: Toshio Maejima, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 95 days.

(21) Appl. No.: 11/699,534

(22) Filed: Jan. 29, 2007

(65) Prior Publication Data

US 2007/0188227 A1    Aug. 16, 2007

(30) Foreign Application Priority Data

Jan. 30, 2006    (JP) .............................. 2006-021367

(51) Int. Cl.
*H03F 3/217* (2006.01)
(52) U.S. Cl. ................... 330/251; 330/207 A
(58) Field of Classification Search ............ 330/10, 330/207 A, 251
See application file for complete search history.

(56) References Cited

U.S. PATENT DOCUMENTS 6,727,748 B2 *    4/2004    Kuo ............................. 330/9

6,727,752 B2 *    4/2004    Skinner et al. ............. 330/251
2005/0156665 A1    7/2005    Maejima

FOREIGN PATENT DOCUMENTS

JP    6-152268    5/1994

* cited by examiner

*Primary Examiner*—Steven J Mottola
(74) *Attorney, Agent, or Firm*—Pillsbury Winthrop Shaw Pittman LLP (57) ABSTRACT

PWM signals having different polarities input from a +IN terminal and a –IN terminal are output to a pre-driver and a switching signal generation circuit. The pre-driver outputs to switches a gate signal for actuating a driver obtained from the input PWM signal. The switching signal generation circuit inputs a PWM signal and outputs switching signals. A switching circuit, on input of the switching signals, changes over switches so that the gate signal is output to a first P-channel MOS transistor and a first N-channel MOS transistor in case the PWM signal is input from the +IN side, and to a second P-channel MOS transistor and a second N-channel MOS transistor in case the PWM signal is input from the –IN side.

10 Claims, 7 Drawing Sheets

AMPLIFIER

BACKGROUND OF THE INVENTION

The present invention relates to an amplifier, for amplifying an analog signal or a digital signal, an output stage of which is a bridge structure.

In the related art, for example, in a class-D amplifier used as an amplifier for driving a loudspeaker, there is known a class D amplifier that inputs an analog or digital audio signal to perform PWM (Pulse Width Modulation) on the signal and amplifies the PWM-modulated signal to drive a load circuit with a bridge structure driver (by using a BTL or Bridged Transformer Less connection).

Figure 7:
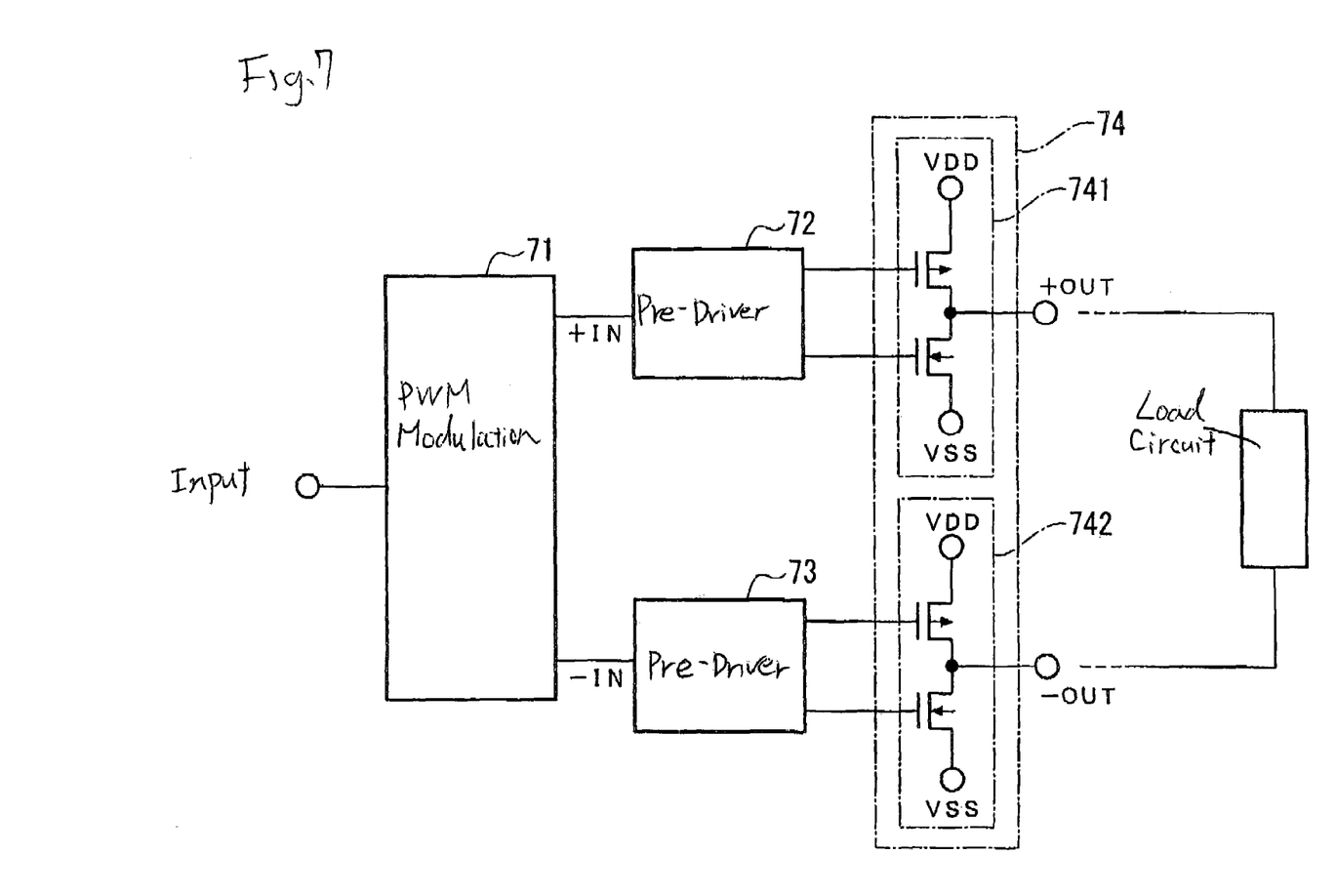
FIG. 7 is a block diagram showing a related art class D amplifier.

FIG. 7 is a block diagram of a related art class D amplifier including a PWM modulator 71 two pre-drivers 72, 73 and a driver 74. The driver 74 includes-four switches. In FIG. 7, the driver 74 is shown as two drivers 741 and two drivers 742. The PWM modulator 71 input an analog or digital audio signal to perform PWM modulation on the signal and outputs the modulated signal to the pre-drivers 72, 73. The PWM modulator 71 outputs a signal +IN for output to a +OUT terminal to the pre-driver 72 and outputs a signal −IN for output to an −OUT terminal to the pre-driver 73.

Figure 8:
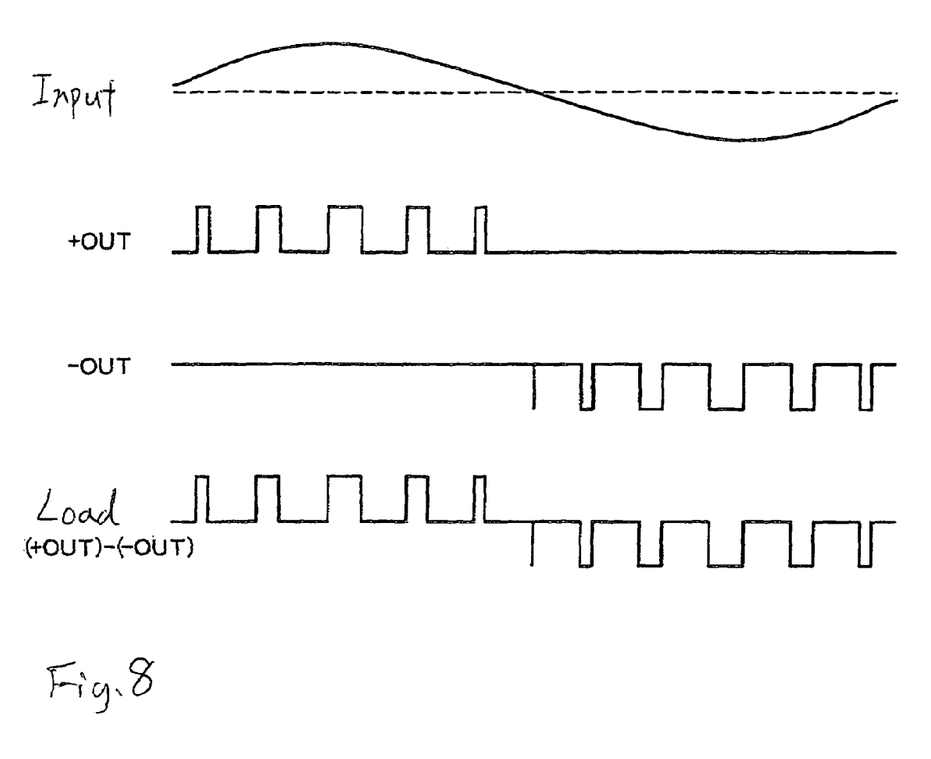
FIG. 8 shows the relationship between the signal input and signal output in the class D amplifier in FIG. 7.

In the related art class D amplifier, a modulation method is used that reduces the output at the time of the absence of a signal to substantially zero in order to reduce power losses (for example, refer to Patent Reference 1). The relationship between input and output in this method is shown in FIG. 8. While input is represented as an analog value in FIG. 8, a digital value as input results in the same operation.

In FIG. 8, when an input signal is positive, a PWM-modulated signal is output to the +OUT terminal. When an input signal is negative, a PWM-modulated signal is output to the −OUT terminal. Because the load circuit is connected between the +OUT terminal and the −OUT terminal, the difference (+OUT)−(−OUT) between the output signal from the +OUT terminal and the output signal from the −OUT terminal serves as input to the load circuit.

The pre-driver 72 inputs one PWM signal from the PWM modulator 71 and outputs a gate signal for actuating a driver 741 to the driver 741. The driver 741 amplifies a gate signal input from the pre-driver 72 and outputs a BTL signal with positive polarity from the +OUT terminal.

Similarly, the pre-driver 73 inputs the other PWM signal from the PWM modulator 72 and outputs a gate signal for actuating a driver 742 to the driver 742. The driver 742 amplifies the gate signal input from the pre-driver 73 and outputs a BTL signal with negative polarity from the −OUT terminal.

In the BTL-connection class D amplifier, when a high potential (High level) is continuously output from either the +OUT terminal or −OUT terminal, the other output is at a low potential (Low level). On that occasion, one of the two pre-drivers 72, 73 is operating and the other pre-driver is in a sleep state to output a Low level.

The switching amplifier disclosed in Patent Reference 2 simultaneously drives four switches constituting an output stage, thus requiring two separate amplifiers for driving two outputs.

Patent Reference 1: JP-A-2006-042296
Patent Reference 2: JP-A-06-152268

In the related art amplifier, one of the two pre-drivers may be in the sleep state. Two pre-drivers are required although one pre-driver circuit in the sleep state is unnecessary. This results in a larger chip area of an amplifier.

SUMMARY OF THE INVENTION

The invention has been accomplished in view of the aforementioned circumstances. An object of the invention is to reduce the chip area of a bridge-connection amplifier that amplifies an analog signal or a digital signal.

In order to solve the above problem, the present invention is characterized by having the following arrangement.

(1) A bridge structure amplifier comprising:
a pre-driver that includes a first input for inputting a signal with a first polarity and a second input for inputting a signal with a second polarity;
a determination circuit that determines which of the first input and the second input a signal is input from;
a bridge structure driver including a plurality of switches; and
a first switching circuit inserted between the pre-driver and the driver;
wherein the pre-driver generates a control signal for controlling a current flowing through the plurality of switches based on input signals from the first and second inputs, and
wherein the first switching circuit selects a predetermined switch from the plurality of switches based on a determination result of the determination circuit and outputs the control signal generated by the pre-driver to a control input of the switch.

(2) The bridge structure amplifier according to (1), wherein the driver includes four switches.

(3) The bridge structure amplifier according to (2), wherein
two of the four switches form a first complementary switching circuit pair for the first polarity and the others form a second complementary switching circuit pair for the second polarity,
when the determination circuit determines that the signal is input from the first input, the first switching circuit selects the first complementary switching circuit pair, and
when the determination circuit determines that the signal is input from the second input, the first switching circuit selects the second complementary switching circuit pair.

(4) The bridge structure amplifier according to (1) further comprising a second switching circuit for fixing the switch not selected by the first switching circuit to a predetermined potential.

(5) The bridge structure amplifier according to (1), wherein a pull-up resistor is arranged at the control input of each of the plurality of switches.

(6) The bridge structure amplifier according to (1), wherein a latch circuit for retaining the potential of the control input is arranged at the control input of each of the plurality of switches.

(7) The bridge structure amplifier according to (1), wherein the determination circuit retains output from when the determination circuit receives a signal from one of the first and second inputs to when the determination circuit receives a signal from the other input and changes the output at the time point the determination circuit receives the signal from the other input.

According to the invention, it is possible to selectively drive a plurality of switches constituting a bridge structure driver by switching a control signal from a pre-driver between output destinations by way of the switching circuit. It is thus possible to omit a pre-driver unlike in a related art amplifier that requires two pre-drivers to actuate a driver. This reduces the chip area of an amplifier.

DETAILED DESCRIPTION OF PREFERRED EMBODIMENTS

An embodiment of the invention will be described with reference to drawings.

Figure 1:
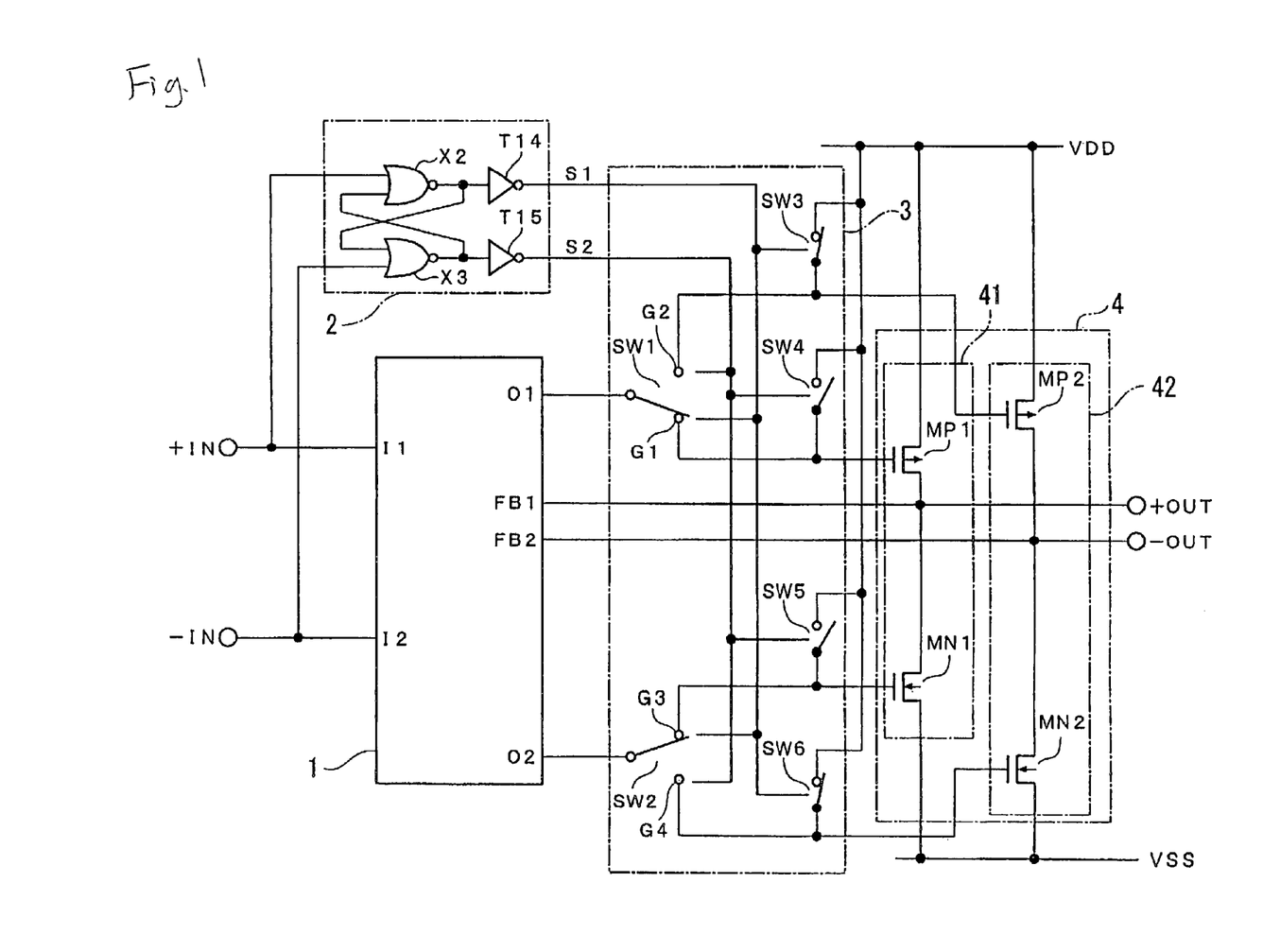
FIG. 1 is a circuit diagram showing the configuration of a class D amplifier according to an embodiment of the invention.

FIG. 1 is a circuit diagram showing the configuration of a class D amplifier according to an embodiment of the invention. The class D amplifier shown in FIG. 1 comprises: a pre-driver 1 for inputting a PWM signal and outputting a gate signal to actuate a driver 4; switching signal generation circuit 2 (determination circuit) for generating a switching signal to be supplied to a switching circuit 3; and a switching circuit 3 (switching circuit) for switching between the +OUT terminal and −OUT terminal from which the output of the pre-driver 1 is obtained; and a driver 4 for outputting to a load circuit.

A +IN terminal (first input) and a −IN terminal (second input) are terminals respectively inputting two PWM signals with positive polarity (first polarity) and negative polarity (second polarity) obtained by PWM-modulating an audio signal in a PWM modulator (not shown). The +IN terminal is connected to the I1 terminal of the pre-driver 1 and one of the input terminals of a NOR circuit X2 in the switching signal generation circuit 2. The −IN terminal is connected to the I2 terminal of the pre-driver 1 and one of the input terminals of a NOR circuit X3 in the switching signal generation circuit 2.

The O1 terminal as an output terminal of the pre-driver 1 is connected to one end of the switch SW1 in the switching circuit 3. The O2 terminal as an output terminal of the pre-driver 1 is connected to one end of the switch SW2 in the switching circuit 3. Detailed circuit configuration in the pre-driver 1 will be described referring to FIG. 2.

The switching signal -generation circuit 2 has an R-S flip-flop structure and includes two NOR circuits X2, X3 and two NOT circuits T14, T15. Another input terminal of the NOR circuit X2 is connected to the output terminal of the NOR circuit X3 and the input terminal of the NOT circuit T15. Another input terminal of the NOR circuit X3 is connected to the output terminal of the NOR circuit X2 and the input terminal of the NOT circuit T14.

When the +IN terminal is driven High, output S1 of the NOT circuit T14 becomes High and output S2 of the NOT circuit T15 becomes Low and maintains this state until the +IN terminal is kept being driven High. After this, when the −IN terminal becomes High level, the output S2 of the NOT circuit T14 changes from Low to High, and then +IN terminal becomes High level and is kept in this state. A PWM modulator is set so that the +IN terminal and the −IN terminal will not be simultaneously driven High.

The output S1 of the NOT circuit T14 is connected to the control terminals of the switches SW1, SW2, SW3, SW6 of the switching circuit 3. The output S2 of the NOT circuit T15 is connected to the control terminals of the switches SW1, SW2, SW4, SW5 of the switching circuit 3. Hereinafter, a signal output from the NOT circuit T14 is referred to as a switching signal S1 and a signal output from the NOT circuit T15 is referred to as a switching signal S2.

The switching circuit 3 includes switches SW1 through SW6. The switch SW1 inputs the switching signals S1, S2 and secures connection from the O1 terminal of the pre-driver 1 to the G1 terminal when the switching signal S1 is High and the switching signal S2 is Low. On the other hand, when the switching signal S1 is Low and the switching signal S2 is High, the switch SW1 secures connection from the O1 terminal of the pre-driver 1 to the G2 terminal.

Similarly, the switch SW2 inputs the switching signals S1, S2 and secures connection from the O2 terminal of the pre-driver 1 to the G3 terminal when the switching signal S1 is High and the switching signal S2 is Low. On the other hand, when the switching signal S1 is Low and the switching signal S2 is High, the switch SW2 secures connection from the O2 terminal of the pre-driver 1 to the G4 terminal.

The switches SW3 through SW6 are ON when the control signal is High and OFF when the control signal is Low. The state of each of the switches SW1 through SW6 shown in FIG. 1 assumes that the switching signal S1 is High and the switching signal S2 is Low.

One end of the switch SW3 is connected to a high voltage side power source VDD and the other end is connected to the G2 terminal of the switch SW1 and the gate of a P-channel MOS (Metal Oxide Semiconductor) transistor MP2. One end of the switch SW4 is connected to the high voltage side power source VDD and the other end is connected to the G1 terminal of the switch SW1 and the gate of a P-channel MOS transistor MP1.

One end of the switch SW5 is connected to the high voltage side power source VDD and the other end is connected to the G3 terminal of the switch SW2 and the gate of an N-channel MOS transistor MN1. One end of the switch SW6 is connected to the high voltage side power source VDD and the other end is connected to the G4 terminal of the switch SW2 and the gate of an N-channel MOS transistor MN2.

A driver 4 includes four switches, that is, P-channel transistors MP1, MP2 and N-channel MOS transistors MN1, MN2. The gate of each transistor is control input of each switch. A voltage applied to this gate controls a current flowing between the drain and the source. The P-channel MOS transistor MP1, and the N-channel MOS transistor MN1 form a complementary switching circuit pair so that a combination of the P-channel MOS transistor MP1 and the N-channel MOS transistor MN1 will be described as a driver 41. Similarly, a combination of the P-channel MOS transistor MP2 and the N-channel MOS transistor MN2 will be described as a driver 42.

The source of the P-channel MOS transistor MP 1 is connected to the high voltage side power source VDD and the drain of the P-channel MOS transistor MP 1 is connected to the +OUT terminal, the drain of the N-channel MOS transistor MN1 and the FB1 terminal of the pre-driver 1. The source of the N-channel MOS transistor MN1 is connected to a low voltage side power source VSS.

The source of the P-channel MOS transistor MP 2 is connected to the high voltage side power source VDD and the drain of the P-channel MOS transistor MP 2 is connected to the −OUT terminal, the drain of the N-channel MOS transistor MN2 and the FB2 terminal of the pre-driver 1. The source of the N-channel MOS transistor MN2 is connected to the low voltage side power source VSS.

Figure 2:
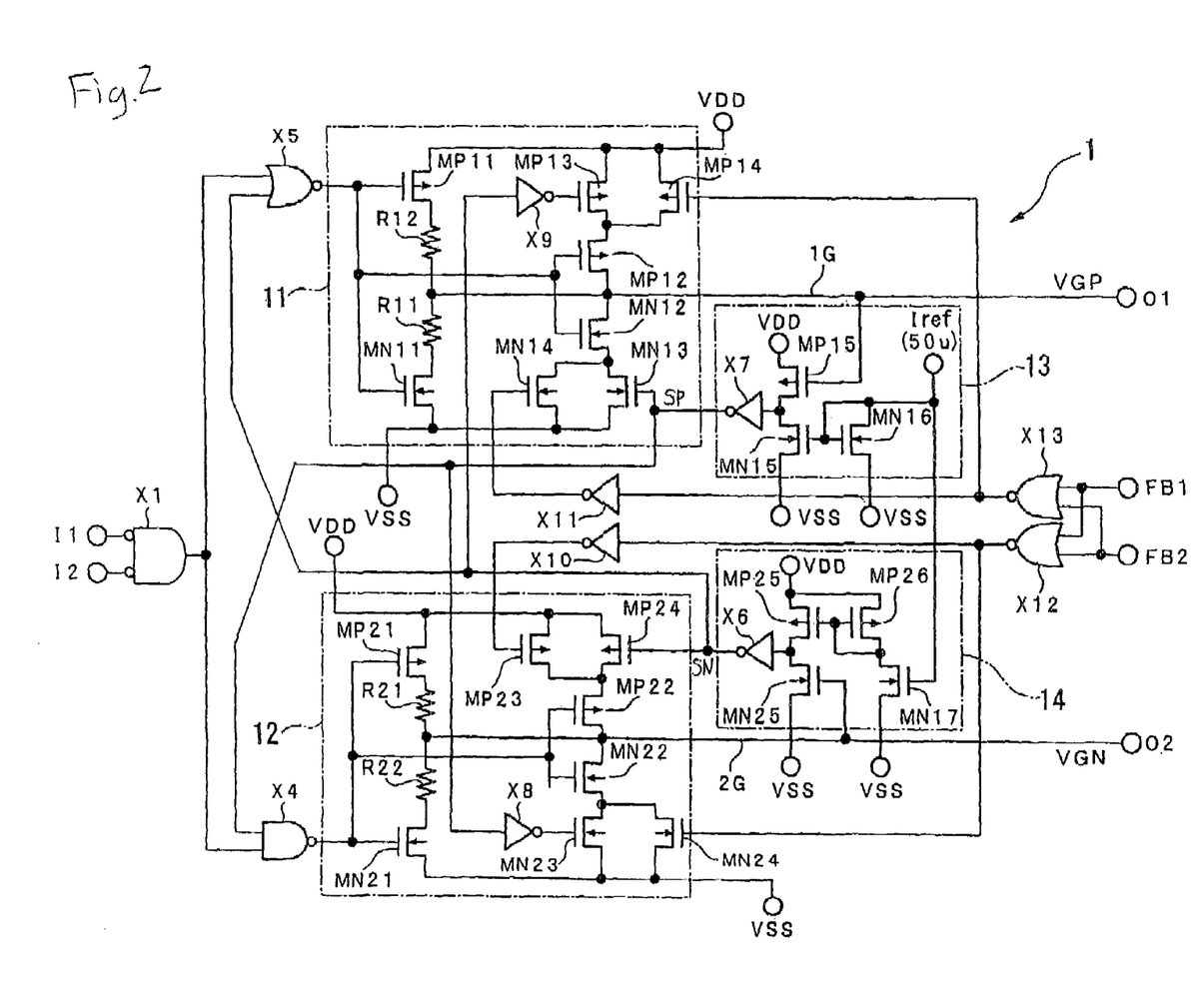
FIG. 2 is a circuit diagram showing the detailed circuit configuration of a pre-driver 1 in FIG. 1.

Detailed circuit configuration of the pre-driver 1 will be described referring to FIG. 2.

An I1 terminal and an I2 terminal are respectively connected to two input terminals of a Low-active AND circuit X1. The output of the AND circuit X1 is connected to one input terminal of a NOR circuit X5 and one input terminal of a NAND circuit X4.

The output of the NOR circuit X5 is input to a P-channel pre-driver 11 and the output of the NAND circuit X4 is input to an N-channel pre-driver 12. The P-channel pre-driver 11 is a circuit that generates a gate signal for driving the P-channel MOS transistor MP1 (MP2) shown in FIG. 1. The N-channel pre-driver 12 is a circuit that generates a gate signal for driving the N-channel MOS transistor MN1 (MN2) shown in FIG. 1.

The output of the P-channel pre-driver 11 is output to the switch SW1 in FIG. 1 via the O1 terminal. The output of the N-channel pre-driver 12 is output to the switch SW2 in FIG. 1 via the O2 terminal.

A P-channel gate voltage determination circuit 13 is a circuit that determines whether the output O1 of the P-channel pre-driver 11 is High or Low. In case the output O1 of the P-channel pre-driver 11 is High, the output of a NOT circuit X7 is High. In case the output O1 of the P-channel pre-driver 11 is Low, the output of the NOT circuit X7 is Low.

The output of the P-channel gate voltage determination circuit 13 (that is, the output of the NOT circuit X7) is input to another input terminal of the NAND circuit X4 as well as the gate of an N-channel MOS transistor MN13 in the P-channel pre-driver 11 and a NOT circuit X8 in the N-channel pre-driver 12.

An N-channel gate voltage determination circuit 14 is a circuit that determines whether the output O2 of the N-channel pre-driver 12 is High or Low. In case the output O2 of the N-channel pre-driver 12 is High, the output of a NOT circuit X6 is High. In case the output O2 of the N-channel pre-driver 12 is Low, the output of the NOT circuit X6 is Low.

The output of the N-channel gate voltage determination circuit 14 (that is, the output of the NOT circuit X6) is input to another input terminal of the NOR circuit X5 as well as the gate of a P-channel MOS transistor MP24 in the N-channel pre-driver 12 and a NOT circuit X9 in the P-channel pre-driver 11.

The FB1 terminal is a terminal that inputs via feedback a signal output from the +OUT terminal in FIG. 1. The FB1 terminal is connected to an input terminal of each of NOR circuits X13 and X12. The FB2 terminal is a terminal that inputs via feedback a signal output from the −OUT terminal in FIG. 1. The FB2 terminal is connected to another input terminal of each of the NOR circuits X13 and X12.

The output of the NOR circuit X13 is input to a NOT circuit X11 and the gate of a P-channel MOS transistor MP14 in the P-channel pre-driver 11. The output of the NOT circuit X11 is input to the gate of an N-channel MOS transistor MN14 in the P-channel pre-driver 11.

The output of the NOR circuit X12 is input to a NOT circuit X10 and the gate of an N-channel MOS transistor MN24 in the N-channel pre-driver 12. The output of the NOT circuit X10 is input to the gate of a P-channel MOS transistor MP23 in the N-channel pre-driver 12.

Next, detailed configuration of each of the P-channel gate voltage determination circuit 13, the N-channel gate voltage determination circuit 14, the P-channel pre-driver 11 and the N-channel pre-driver 12 will be described in this order.

In the P-channel gate voltage determination circuit 13, N-channel MOS transistors MN15 and MN16 form a current mirror. A current (for example, k1·I) proportional to the current of a constant current source I inserted between the drain of the N-channel MOS transistor MN16 and the high voltage side power source VDD flows in the N-channel MOS transistor MN15.

Between the drain of the N-channel MOS transistor MN15 and the high voltage side power source VDD is inserted a P-channel MOS transistor MP15. The gate of the P-channel MOS transistor MP15 is connected to a signal line 1G output from the O1 terminal and providing a gate voltage VGP to the P-channel transistor MP1 or MP2. An inverter X7 inverts the level of the output signal from the drain of the N-channel MOS transistor MN15 and outputs the resulting signal as a signal SP.

In this configuration, while the gate voltage VGP on the signal line G1 is High (output voltage level of the high voltage side power source VDD), the P-channel transistor MP15 is OFF so that the signal SP is High.

In case the gate voltage VGP is low enough to turn on the P-channel transistor MP1 (or MP2) and a current exceeding k1·I attempts to flow in the P-channel transistor MP15, the drain voltage of the N-channel MOS transistor MN15 rises and the signal SP is driven Low.

In the N-channel gate voltage determination circuit 14, P-channel MOS transistors MP25 and MP26 form a current mirror. Between the drain of the P-channel MOS transistor MP26 and the low voltage side power source VSS is inserted an N-channel MOS transistor MN17.

The gate of the N-channel MOS transistor MN17 is connected to the gate of each of the N-channel MOS transistors MN15 and MN16. Thus, a current (for example, k2·1) proportional to the current of the constant current source I flows in the P-channel MOS transistor MP25.

Between the drain of the P-channel MOS transistor MP25 and the low voltage side power source VSS is inserted an N-channel MOS transistor MN25. The gate of the N-channel MOS transistor MN25 is connected to a signal line 2G output from the O2 terminal and providing a gate voltage VGN to the N-channel transistor MN1 or MN2. An inverter X6 inverts the level of the output signal from the drain of the P-channel MOS transistor MP25 and outputs the resulting signal as a signal SN.

In this configuration, while the gate voltage VGN on the signal line G2 is Low (output voltage level of the low voltage side power source VSS), the N-channel transistor MN25 is OFF so that the signal SN is Low.

In case the gate voltage VGN is high enough to turn on the N-channel transistor MN1 (or MN2) and a current exceeding k2·I attempts to flow in the N-channel transistor MN25, the drain voltage of the P-channel MOS transistor MP25 drops and the signal SN is driven High.

In the P-channel pre-driver 11, a P-channel transistor MP11 and an N-channel transistor MN11 are inserted in series between the high voltage side power source VDD and the low voltage side power source VSS to form an inverter. The gate of each of the transistors is connected to the output terminal of the NOR circuit X5 and the drain of each of the transistors is connected to the signal line G1 in common.

To the signal line G1 is connected the drain of each of a P-channel transistor MP12 and an N-channel transistor MN12. The gate of each of the transistors is connected to the output terminal of the NOR circuit X5. Between the source of the P-channel transistor MP12 and the high voltage side power source VDD are inserted in parallel P-channel transistors MP13 and MP14.

To the gate of the P-channel transistor MP13 is provided a signal having a level inverted from the signal SN as the output of the N-channel gate voltage determination circuit 14 by the inverter X9. To the gate of the P-channel MOS transistor MP14 is provided the output signal of the NOR circuit X13.

Between the source of the N-channel transistor MN12 and the low voltage side power source VSS are inserted in parallel N-channel MOS transistors MN13 and MN14. To the gate of the N-channel transistor MN13 is provided a signal SP. To the gate of the N-channel transistor MN14 is provided the output signal of the inverter X11.

In the N-channel pre-driver 12, a P-channel transistor MP21 and an N-channel transistor MN21 are inserted in series between the high voltage side power source VDD and the low voltage side power source VSS to form an inverter. The gate of each of the transistors is connected to the output terminal of the NAND circuit X4 and the drain of each of the transistors is connected to the signal line 2G in common.

To the signal line 2G is connected the drain of each of a P-channel transistor MP22 and an N-channel transistor MN22. The gate of each of the transistors is connected to the output terminal of the NAND circuit X4. Between the source of the P-channel transistor MP22 and the high voltage side power source VDD are inserted in parallel P-channel transistors MP23 and MP24.

To the gate of the P-channel transistor MP23 is provided the output signal of the inverter X10. To the gate of the P-channel transistor MP24 is provided the signal SN.

Between the source of the N-channel transistor MN22 and the low voltage side power source VSS are inserted in parallel N-channel MOS transistors MN23 and MN24. To the gate of the N-channel transistor MN23 is provided a signal having a level inverted from the signal SP by the inverter X8. To the gate of the N-channel MOS transistor MN24 is provided the output signal of the NOR circuit X12.

The P-channel pre-driver 11 and the N-channel pre-driver 12 described above includes a plurality of transistors connected in parallel as means for driving the P-channel MOS transistor MP1 (MP2) and the N-channel MOS transistor MN1 (MN2) in the output stage. By selectively using the transistors, it is possible to control a gain assumed when each transistor of the driver 4 in the output stage is shifted from ON state to OFF state or from OFF state to ON state depending on the output of the NOR circuit X5 or output of the NAND circuit X4.

With this configuration, in a process where the P-channel pre-driver 11 or N-channel pre-driver 12 drives the P-channel MOS transistor MP1 (MP2) or N-channel MOS transistor MN1 (MN2) for a shift from ON state to OFF state, when the output voltage of the P-channel MOS transistor MP1 (MP2) or N-channel MOS transistor MN1 (MN2) has exceeded a reference level (threshold level of the NOR circuits X12, X13), first gain control is made by the P-channel gate voltage determination circuit 13 and the N-channel gate voltage determination circuit 14 so as to decrease the gain of the P-channel pre-driver 11 or N-channel pre-driver 12. This suppresses possible overshoot or undershoot appearing on a signal output from the +OUT terminal or −OUT terminal.

In a process where the P-channel pre-driver 11 or N-channel pre-driver 12 drives the P-channel MOS transistor MP1 (MP2) or N-channel MOS transistor MN1 (MN2) for a shift from OFF state to ON state, in a period from when a current starts to flow in the P-channel MOS transistor MP1 (MP2) or N-channel MOS transistor MN1 (MN2) to when the output voltage of the P-channel MOS transistor MP1 (MP2) or N-channel MOS transistor MN1 (MN2) has reached a reference level (threshold level of the NOR circuits X12, X13), second gain control is made by the P-channel gate voltage determination circuit 13 and the N-channel gate voltage determination circuit 14 so as to decrease the gain (driving capability) of the P-channel pre-driver 11 or N-channel pre-driver 12. This prevents an abrupt change in the current flowing in the P-channel MOS transistor MP1 (MP2) or N-channel MOS transistor MN1 (MN2) thereby preventing possible noise.

The first and second gain control procedures work to alleviate a change in the current flowing in the P-channel MOS transistor MP1 (MP2) or N-channel MOS transistor MN1 (MN2). This suppresses noise attributable to an inductive load connected to the rear stage of the class D amplifier in FIG. 1 as well as noise attributable to a parasitic inductance in a power line or a ground line.

Figure 3:
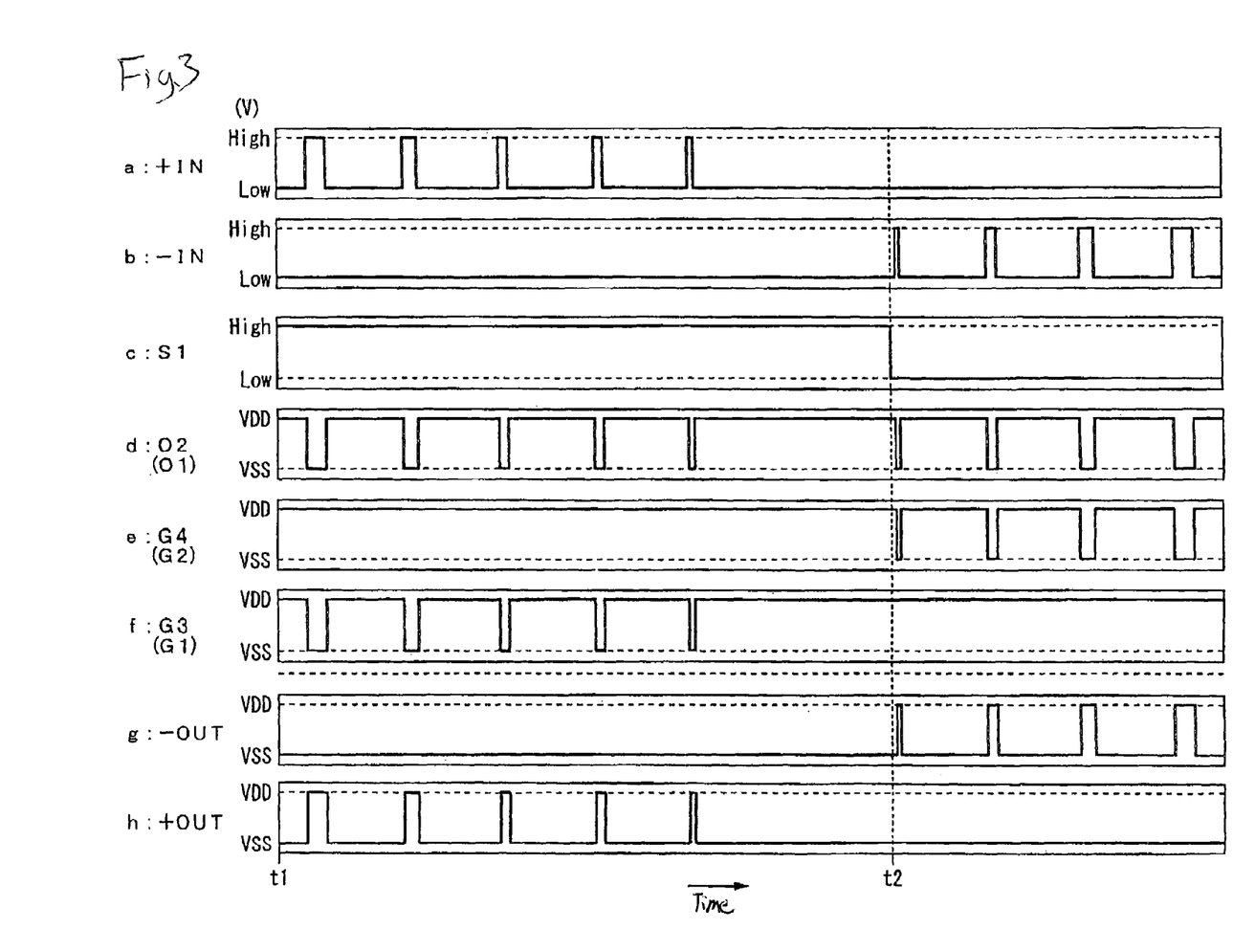
FIG. 3 is a timing chart of a signal appearing at each section of the class D amplifier in FIG. 1.

Operation of the above embodiment will be described referring to the timing chart of FIG. 3. In FIG. 3, while a PWM signal is input from the +IN terminal and the −IN terminal is kept Low (a, b in FIG. 3: time t1-t2), the output of the switching signal generation circuit 2 and the switching signal S1 is kept High and the switching signal S2 (the switching signal S2 is an inverted version of the switching signal S1 and is not shown in FIG. 3) is kept Low (c in FIG. 3: time t1-t2).

Talking of the switches in the switching circuit 3, the switch SW1 is connected to the G1 terminal, the switch SW2 is connected to the G3 terminal, the switches SW3, SW6 are turned ON, and the switches S4, S5 are turned OFF.

In other words, outputs from the O1 terminal and O2 terminal of the pre-driver 1 are respectively input to the gates of the P-channel MOS transistor MP1 (G1) and the N-channel MOS transistor MN1 (G3). The gate of each of the P-channel MOS transistor MP2 and N-channel MOS transistor MN2 is driven High.

A signal corresponding to the input from the +IN terminal is output from the +OUT terminal. The output from the −OUT terminal is substantially at the same potential as the low voltage side power source VSS because the P-channel MOS transistor MP2 is OFF and the N-channel MOS transistor MN2 is ON (h, g in FIG. 3: time t1-t2).

When a PWM signal is input from the −IN terminal (b in FIG. 3: time t2-), the logic of the output from the switching signal generation circuit 2 is inverted so that the switching signal S1 is driven Low and the switching signal S2 is driven High (c in FIG. 3: time t2-). In this case, the +IN terminal is kept Low (a in FIG. 3: time t2-).

When the logic of the output from the switching signal generation circuit 2 is inverted and accordingly the switching signal S1 is driven Low and the switching signal S1 is driven High, the switches in the switching circuit 3 are changed over. The switch SW1 is connected to the G2 terminal, the switch SW2 is connected to the G4 side, the switches SW3, SW6 are turned OFF and the switches SW4, SW5 are turned ON.

In other words, outputs from the O1 terminal and O2 terminal of the pre-driver 1 are respectively input to the gates of the P-channel MOS transistor MP2 and the N-channel MOS transistor MN2. The gate of each of the P-channel MOS transistor MP1 and N-channel MOS transistor MN1 is driven High.

A signal corresponding to the input from the −IN terminal is output from the −OUT terminal. The output from the +OUT terminal is substantially at the same potential as the low voltage side power source VSS because the P-channel MOS transistor MP1 is OFF and the N-channel MOS transistor MN1 is ON (h, g in FIG. 3: time t2-).

In the pre-driver 1, a PWM signal from the I1 terminal and a PWM signal from the I2 terminal are input by the low-active AND circuit X1. Irrespective of which terminal a PWM signal is input from, a response to the PWM signal is output from the O1 terminal and the O2 terminal (d in FIG. 3).

The period required for each switch in the switching circuit 3 to be changed over after a PWM signal is input from the −IN terminal is shorter than the period required for the output corresponding to the PWM signal to appear on the O1 terminal and the O2 terminal of the pre-driver 1. At the point in time when a signal is output from the O1 terminal and the O2 terminal, the switches have been changed over.

A signal on the G4 terminal of the switch SW2 in the switching circuit 3 is kept High because connection to the O2 terminal is lost and connection to the high voltage side power source VDD is established while the switching signal S1 is High (switching signal S2 is Low). While the switching signal S1 is Low (switching signal S2 is High), connection to the high voltage side power source VDD is lost and connection to the O2 terminal is established, so that the signal on the G4 terminal matches the output signal from the O2 terminal.

A signal on the G3 terminal of the switch SW2 in the switching circuit 3 matches the output signal from the O2 terminal because connection to the high voltage side power source VDD is lost and connection to the O2 terminal is established while the switching signal S1 is High (switching signal S2 is Low). While the switching signal S1 is Low (switching signal S2 is High), connection to the O2 terminal is lost and connection to the high voltage side power source VDD is established, so that the signal on the G4 terminal is kept High (f in FIG. 3).

While a PWM signal is input from the +IN terminal, the output of the O2 terminal (O1 terminal) is directed to the gate of the N-channel MOS transistor MN1 (P-channel MOS transistor MP1) and the PWM signal is output from the +OUT terminal and the −OUT terminal is fixed to the low voltage side power source VSS (g, h in FIG. 3: time t1-t2).

While a PWM signal is input from the −IN terminal, the output of the O2 terminal (O1 terminal) is directed to the gate of the N-channel MOS transistor MN2 (P-channel MOS transistor MP2) and the PWM signal is output from the −OUT terminal and the +OUT terminal is fixed to the low voltage side power source VSS (g, h in FIG. 3: time t2-).

With the use of the class D amplifier of the invention, it is possible to actuate both the drivers 41 and 41 by selecting a destination to be output through changeover of switches while using output from a single pre-driver. This provides a single-pre-driver configuration instead of the related art double-pre-driver configuration, thereby reducing the chip area.

Figure 4:
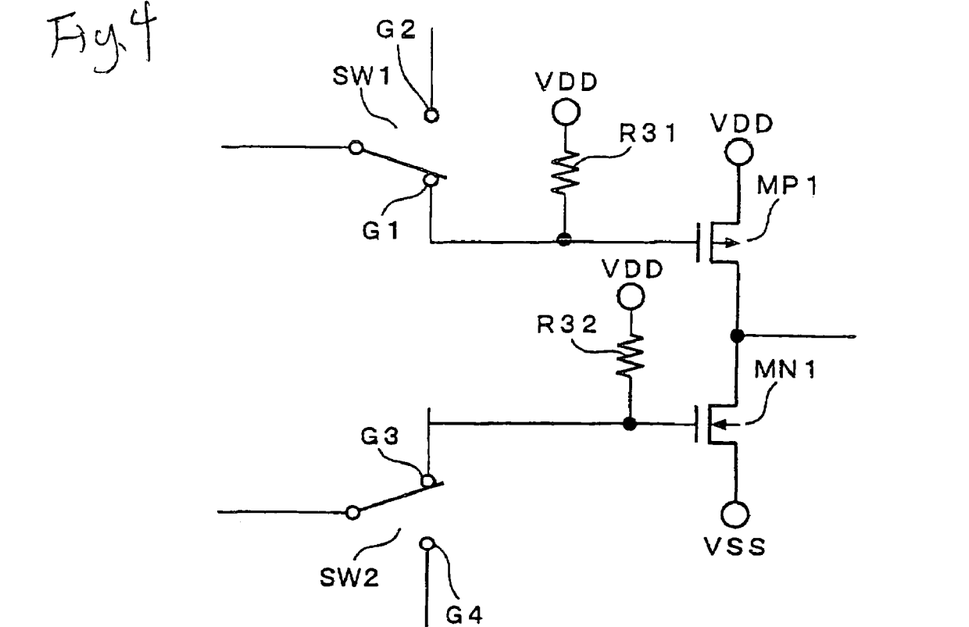
FIG. 4 shows the driver 4 in FIG. 1 using a high value resistor pull-up.
Figure 5:
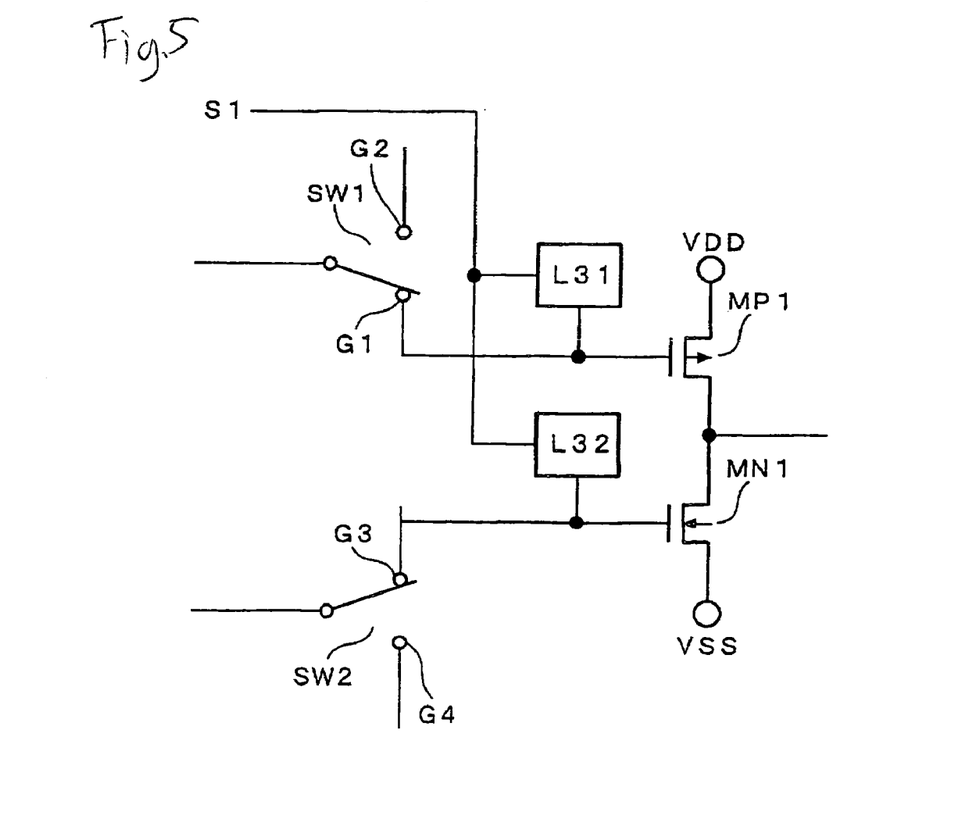
FIG. 5 shows the driver 4 in FIG. 1 using a latch to retain the gate voltage.
Figure 6:
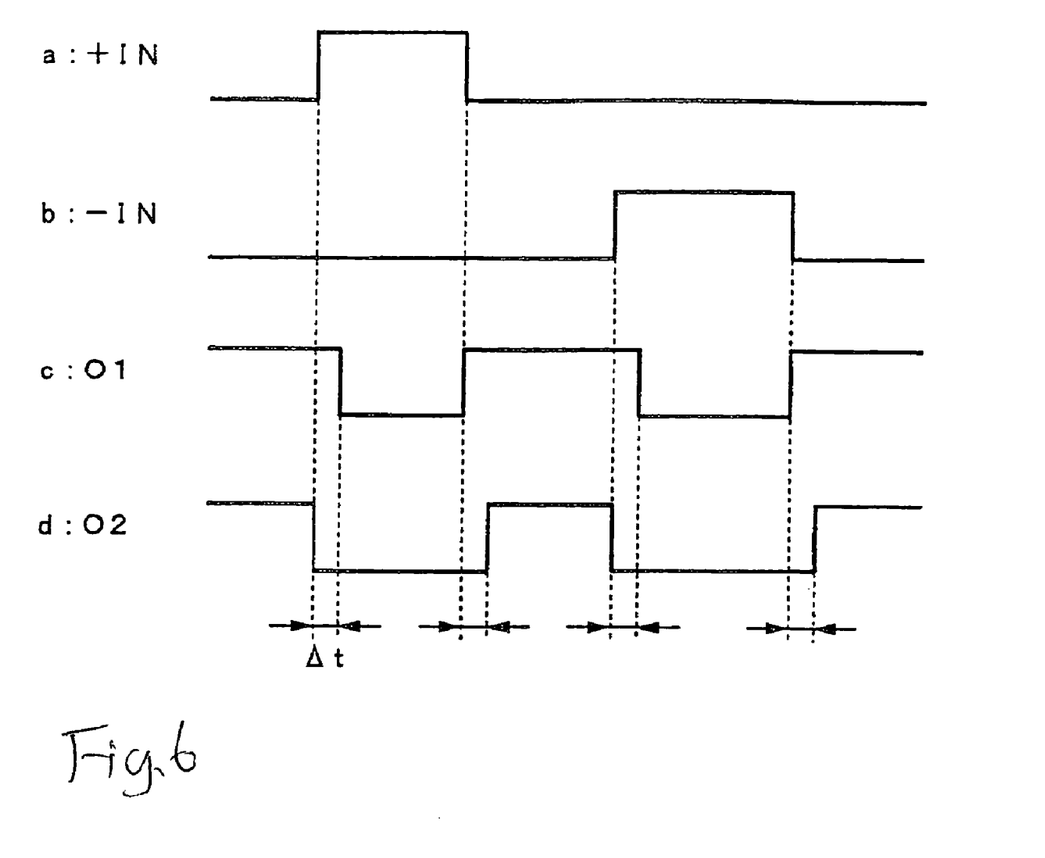
FIG. 6 shows the timing of the rising and falling edges of the output from the O1 and O2 terminals in FIG. 1.

The switches SW3 through SW6 in the switching circuit 3 shown in FIG. 1 may be pulled up by high value resistors R31, R32 (pull-up resistors) as shown in FIG. 4 or may have corresponding gate voltage kept by way of latches L31, L32 as shown in FIG. 5. In such a configuration also, the gate of a driver whose connection with the pre-driver 1 is made unavailable by the switches SW1, SW2 is kept High. This obtains the same effect as the foregoing embodiment.

While the low voltage side power source (VSS) is used for a reference of output, the high voltage side power source (VDD) may be used instead. In this case, the switches SW3, SW4, SW5, SW6 are connected to the low voltage side power source VSS.

While the same output is obtained from the O1 terminal and the O2 terminal in FIG. 3, the timing of rising and falling edges of the output may be different between the O1 terminal and the O2 terminal. With this approach, the gate of the P-channel transistor MP1 (output from the O1 terminal) is driven Low while the gate of the N-channel transistor MN1 (output from the O2 terminal) is driven High, which prevents a flow-through current from flowing.

While the embodiment of the invention has been detailed, a specific configuration is not limited to this embodiment but design changes that do not depart from the scope and spirit of the invention are included in the invention. For example, an analog signal or a digital signal may be input to the inventive amplifier. The invention is applicable to an amplifier employing a switching system other than PWM, such as PDM (Pulse Density Modulation). While the class D amplifier of the invention uses MOS field-effect transistors, other types of transistors or bipolar transistors may be used instead.

The invention is preferably used in a BTL connection amplifier for amplifying an analog signal or a digital signal.

What is claimed is:

1. A bridge structure amplifier comprising:
    a pre-driver that includes a first input for inputting a signal with a first polarity and a second input for inputting a signal with a second polarity;
    a determination circuit that determines which of the first input and the second input a signal is input from;
    a bridge structure driver including a plurality of switches; and
    a first switching circuit inserted between the pre-driver and the driver;
    wherein the pre-driver generates a control signal for controlling a current flowing through the plurality of switches based on input signals from the first and second inputs, and
    wherein the first switching circuit selects a predetermined switch from the plurality of switches based on a determination result of the determination circuit and outputs the control signal generated by the pre-driver to a control input of the switch.

2. The bridge-structure amplifier according to claim 1, wherein the driver includes four switches.

3. The bridge structure amplifier according to claim 2, wherein
    two of the four switches form a first complementary switching circuit pair for the first polarity and the others form a second complementary switching circuit pair for the second polarity,
    when the determination circuit determines that the signal is input from the first input, the first switching circuit selects the first complementary switching circuit pair, and
    when the determination circuit determines that the signal is input from the second input, the first switching circuit selects the second complementary switching circuit pair.

4. The bridge structure amplifier according to claim 1 further comprising a second switching circuit for fixing the switch not selected by the first switching circuit to a predetermined potential.

5. The bridge structure amplifier according to claim 1, wherein a pull-up resistor is arranged at the control input of each of the plurality of switches.

6. The bridge structure amplifier according to claim 1, wherein a latch circuit for retaining the potential of the control input is arranged at the control input of each of the plurality of switches.

7. The bridge structure amplifier according to claim 1, wherein the determination circuit retains output from when the determination circuit receives a signal from one of the first and second inputs to when the determination circuit receives a signal from the other input and changes the output at the time point the determination circuit receives the signal from the other input.

8. The bridge structure amplifier according to claim 1, the pre-driver includes pre-driver unit that drives the bridge structure driver and a gain control circuit that performs first gain control to decrease a gain of the pre-driver unit when the output voltage of the bridge structure driver exceeds a reference level in a process where the pre-driver unit drives the bridge structure driver for a shift from on state to off state.

9. The bridge structure amplifier according to claim 8, wherein the gain control circuit performs second gain control to decrease the gain of the pre-driver unit in a period from when a current starts to flow in the bridge structure driver to when the output voltage of the bridge structure driver reaches the reference level in a process where the pre-driver unit drives the bridge structure driver for a shift from off state to on state.

10. The bridge structure amplifier according to claim 8, wherein
 the pre-driver unit includes a plurality of transistors connected in parallel for driving the bridge structure driver, respectively, and
 the gain control circuit decreases the gain of the pre-driver unit by shifting at least one of the plurality of transistors of the pre-driver unit to off state.

* * * * *